(12) United States Patent
Yu

(10) Patent No.: US 6,936,386 B2
(45) Date of Patent: Aug. 30, 2005

(54) RETICLE ALIGNMENT PROCEDURE

(75) Inventor: Cheng-Hung Yu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/605,677

(22) Filed: Oct. 17, 2003

(65) Prior Publication Data

US 2005/0084778 A1 Apr. 21, 2005

(51) Int. Cl.⁷ .............................. G03F 9/00; G03C 5/00; G01B 11/00
(52) U.S. Cl. .......................... 430/22; 430/30; 356/399; 356/401
(58) Field of Search ..................... 430/22, 30; 356/399, 356/401

(56) References Cited

U.S. PATENT DOCUMENTS 5,942,357 A * 8/1999 Ota ............................. 430/22

* cited by examiner

Primary Examiner—Christopher G. Young
(74) Attorney, Agent, or Firm—Winston Hsu

(57) ABSTRACT

A semiconductor wafer has at least one pre-layer on-wafer alignment mark (pre-layer on-wafer AM) on a top surface of the semiconductor wafer. A baseline check (BCHK) is performed to align a current-layer reticle AM on a current-layer reticle with the pre-layer on-wafer AM. By capturing and comparing signals of the current-layer reticle AM and the pre-layer on-wafer AM, a corresponding coordinate of the current-layer reticle to the semiconductor wafer is calibrated. Finally, a lithography process is performed to transfer the layout of the current-layer reticle AM to the top surface of the semiconductor wafer to form a corresponding current-layer on-wafer AM.

10 Claims, 5 Drawing Sheets

RETICLE ALIGNMENT PROCEDURE

BACKGROUND OF INVENTION

1. Field of the Invention

The present invention relates to a method of aligning wafers, and more particularly, to a method which utilizes a signal of an alignment mark captured from a reticle by a reticle alignment system (RAS) as standard signals to calibrate a pre-layer wafer alignment mark captured by a wafer alignment system (WAS), and further filters unnecessary bias resulting from process errors.

2. Description of the Prior Art

In the manufacturing process of integrated circuits (IC), the lithography process is one of the most important technologies. The quality of the lithography process is evaluated by critical dimension (CD) and alignment accuracy (AA). Besides the performance of the alignment system and the accuracy of metrology, the alignment mark (AM) on the wafer is another factor that affects the alignment accuracy. Circuit accuracy is profoundly affected by the AM, especially when process error happens. Therefore, to design an alignment system that can eliminate the bias through capturing and comparing signals, and moreover to calibrate the biased AM so that the influence of process error can be reduced to a minimum, is an urgent topic for study.

According to operation mode of the wafer alignment systems in the prior art, two common operation systems exist: steppers and scanners. Both the steppers and the scanners utilize the reticle alignment system (RAS) and the wafer alignment system (WAS). Please refer to FIG. 1. FIG. 1 is an operation flow chart of an RAS in the prior art. As shown in FIG. 1, the operation procedure of an RAS in the prior art starts by a start step 100 for installing a reticle to be exposed into a reticle alignment machine (RAM). Then, an interferometer-reset step 102 is performed to reset an interferometer of the RAM, and a stage set step 104 is performed with a field image alignment sensor (FIA sensor).

A reticle load step 106 is performed to load the reticle, and a reticle search alignment step 108 is performed with a video reticle alignment sensor (VRA sensor) to adjust the coordinates of the reticle by rotating the reticle. Then a reticle biased-angle determination step 110 is performed; if the reticle biased-angle is too large, the reticle is removed by a robot arm and rotated to reload, as step 112 and 114 show in FIG. 1. Afterward, a fine alignment step 116 is performed by utilizing a set of alignment marks (AM) of the reticle, and a reticle interferometer calibration step 118 is performed with the VRA sensor.

A reticle rotation compensation step 120 is performed by rotating the reticle. After that, two simultaneous baseline check (simultaneous BCHK) steps 122 and 124 are performed respectively with the FIA sensor and a laser interferometric alignment sensor (LIA sensor) by employing 6 sets of AMs of the reticle to simultaneously fine adjust the corresponding coordinates of the reticle to a baseline of the steppers or the scanners. Finally, a non-simultaneous BCHK step 126 is performed with a laser step alignment sensor (LSA sensor) to accomplish the operation of the RAS of the prior art.

Please refer to FIG. 2. FIG. 2 is an operation flow chart of a WAS in the prior art. As shown in FIG. 2, the operation procedure of a WAS in the prior art starts with a start step 200; a wafer having a pre-layer AM is installed in an RAM. Primarily, a pre-alignment step 202 is performed to align the wafer approximately. Then a first wafer alignment step 204 is performed, a search alignment step 206 is performed with a FIA or a LSA sensor, and a rotation calibration step 208 is performed. If the required rotation angle exceeds 500 micro radians, repeat the pre-alignment step 202; if not, continue performing a second wafer alignment step 210. Thereafter an enhanced global alignment (EGA) step is performed: performing a fine alignment step 212 with the FIA, the LSA, or a LSA sensor to align the wafer with the reticle and calculate the corresponding coordinates of the reticle and the wafer to the baseline so that the coordinates of the reticle and the wafer are on the same baseline; and performing a wafer exposure step 214 to transfer layouts of the circuit pattern of the reticle onto the wafer for accomplishing an overlay procedure in the prior art.

The alignment mark plays an important role in the operation of an RAS. All the above-mentioned FIA, LSA, and LIA sensors are applied to capturing the AM and transferring signals. With the progress of RAM, when errors are already negligible, the quality of lithography process is affected profoundly by the accuracy of AM capturing. However, when the AM is transferred from a precedent process onto the wafer, some inevitable process errors could occur, such as changes of temperature, time, and pressure that reduce the surface uniformity of wafer, or over polishing in the chemical mechanical polishing (CMP) process that cause the distortion of the AM. Because the exposure process is performed when the current layer is aligned with the AM of the precedent layer, the patterns of different layers are overlaid. Images and signals captured and transferred by the FIA, LSA, and LIA would be weakened or biased by inevitable process errors.

Please refer to FIG. 3(a) and FIG. 3(b). FIG. 3(a) is a schematic diagram of normal AM signals captured and transferred by the FIA, LSA, and LIA sensors. FIG. 3(b) is a schematic diagram of biased AM signals captured and transferred by the FIA, LSA, and LIA sensors. As shown in FIG. 3(b), when the AM is damaged because of process errors, signals generated by the AM would derive unnecessary bias that is different from signals generated by a normal AM. The biased signals would affect the reliability and precision of the search alignment step 206 and the fine alignment step 212, and further affect the overlay result of lithography process. Therefore to design a wafer alignment method unaffected by process errors is an important topic for study in the semiconductor manufacturing process.

SUMMARY OF INVENTION

It is therefore a primary objective of the claimed invention to provide a method of utilizing a reticle alignment machine (RAM) to align a semiconductor wafer, which can prevent the alignment step during a lithography process of current layer from being affected by pre-layer process errors.

In a preferred embodiment of the claimed invention, a wafer surface comprises a cell pattern area and a minor pattern area. The minor pattern area comprises at least a pre-layer wafer alignment mark generated during the precedent lithography process. In the preferred embodiment of the present invention, first, a current-layer reticle comprising a current-layer reticle alignment mark and a circuit pattern is provided, then a baseline check (BCHK) process is performed to align the current-layer reticle AM with the pre-layer wafer AM. After that, image signals of the current-layer reticle AM and the pre-layer wafer AM are captured and compared to calibrate the corresponding coordinates of the current layer to the wafer. Finally a lithography process is performed to transfer the circuit pattern of the current-layer reticle and the current-layer reticle AM onto the wafer to form a current-layer wafer AM corresponding to the pre-layer reticle AM within the minor pattern area.

In the reticle alignment procedure of the present invention, a post-reticle alignment step is performed after finishing the reticle alignment procedure of the prior art. An aligned and calibrated VRA sensor is applied to detect the current-layer reticle AM to be exposed, and a charge couple device (CCD) camera is used to capture and compare image signals of the current-layer reticle AM and the corresponding pre-layer wafer AM. In the present invention, the coordinates of the current-layer reticle AM and the pre-layer wafer AM are calibrated by a computer host system connected to the reticle alignment system (RAS) and the wafer alignment system (WAS) of a stepper or a scanner. Therefore in the RAS of the prior art, when signals are captured and transferred from the pre-layer wafer AM by a field image alignment sensor (FIA sensor), a laser interferometric alignment sensor (LIA sensor), and a laser step alignment sensor (LSA sensor), the bias resulting from the precedent process is removed. The current-layer reticle and the pre-layer wafer AM within the minor pattern area are aligned more precisely so that the accuracy of reticle pattern transferring is ensured.

DETAILED DESCRIPTION

Figure 1:
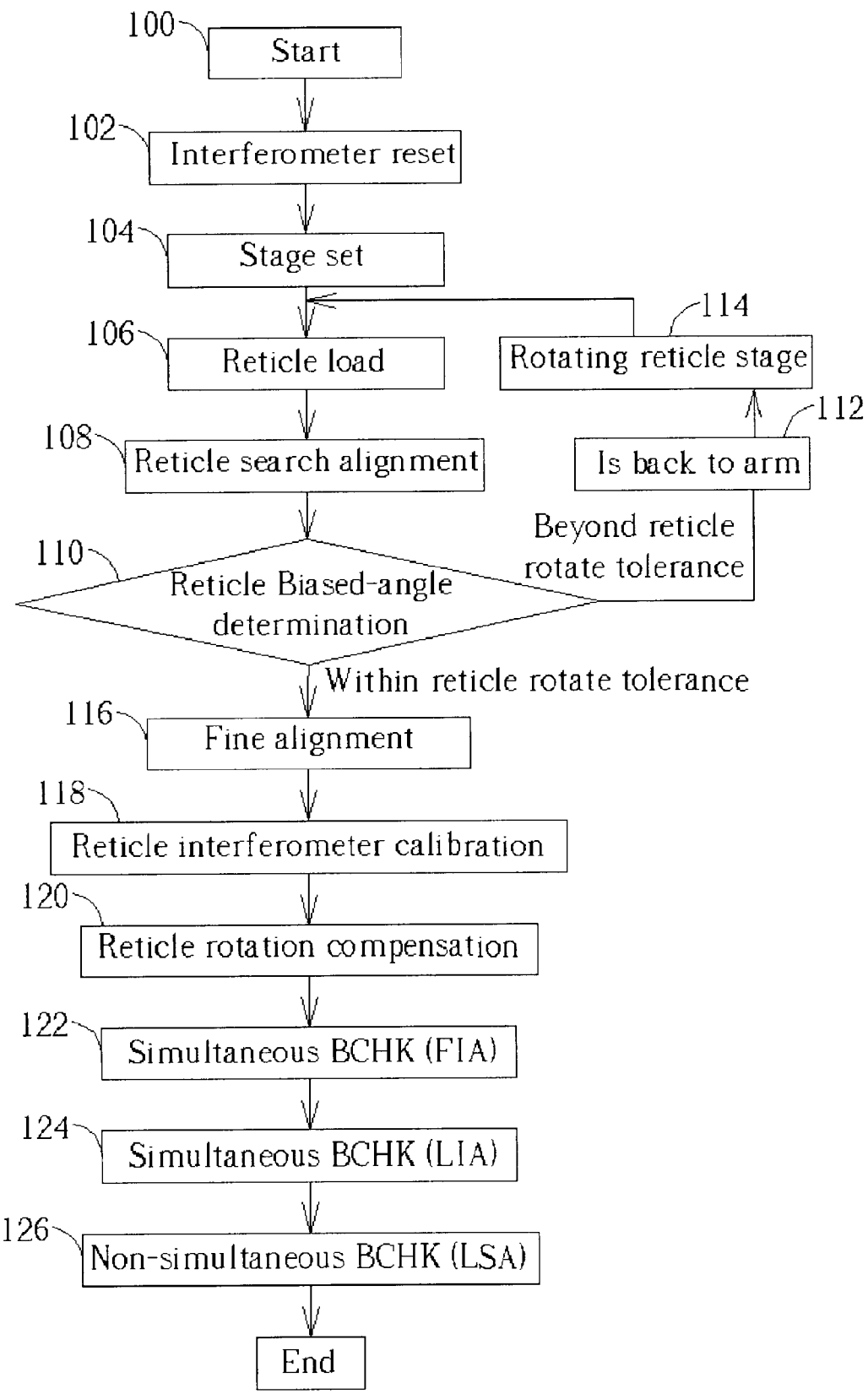
FIG. 1 is an operation flow chart of an RAS in a prior art.
Figure 2:
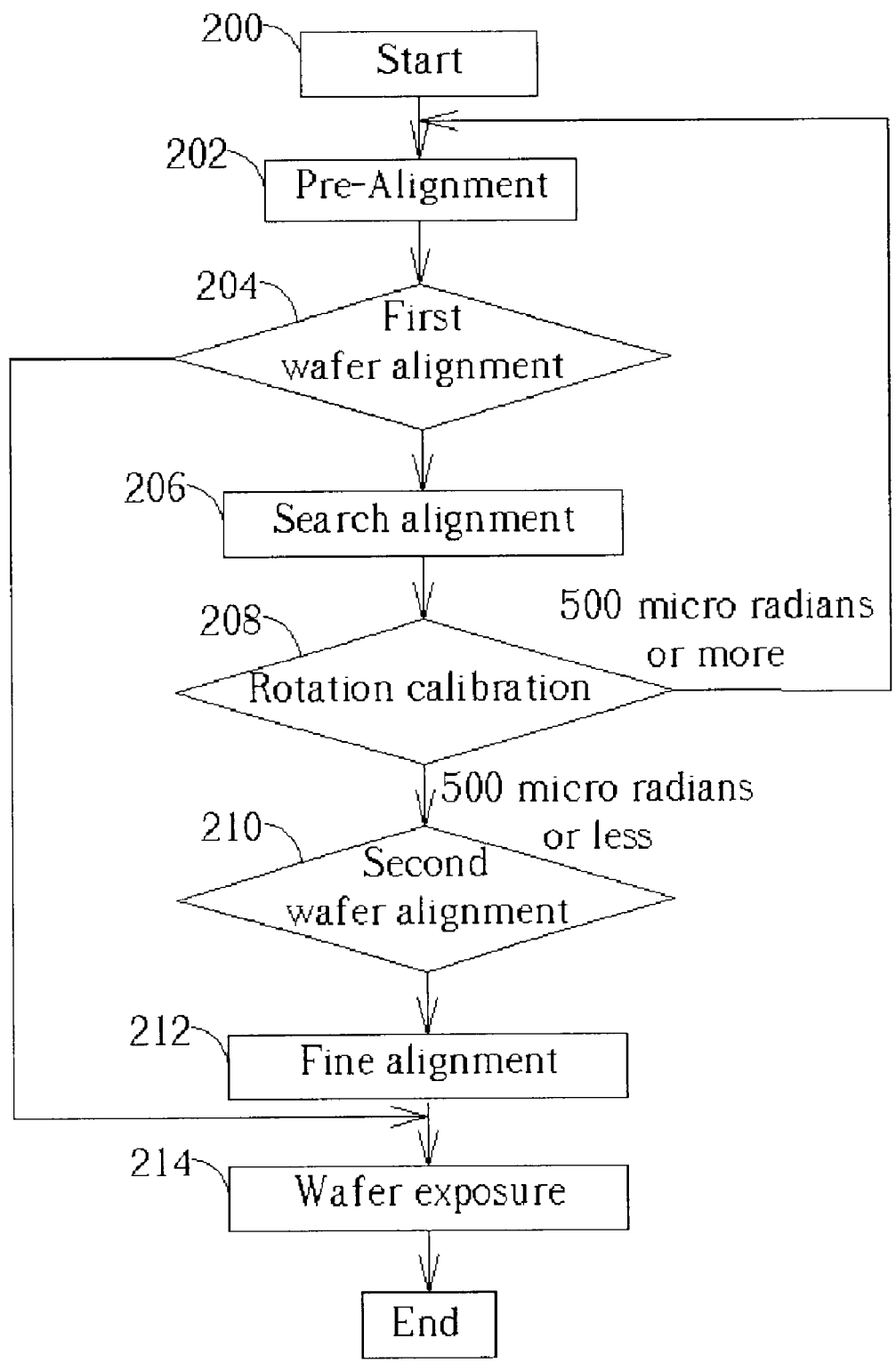
FIG. 2 is an operation flow chart of a WAS in a prior art.
Figure 3A:
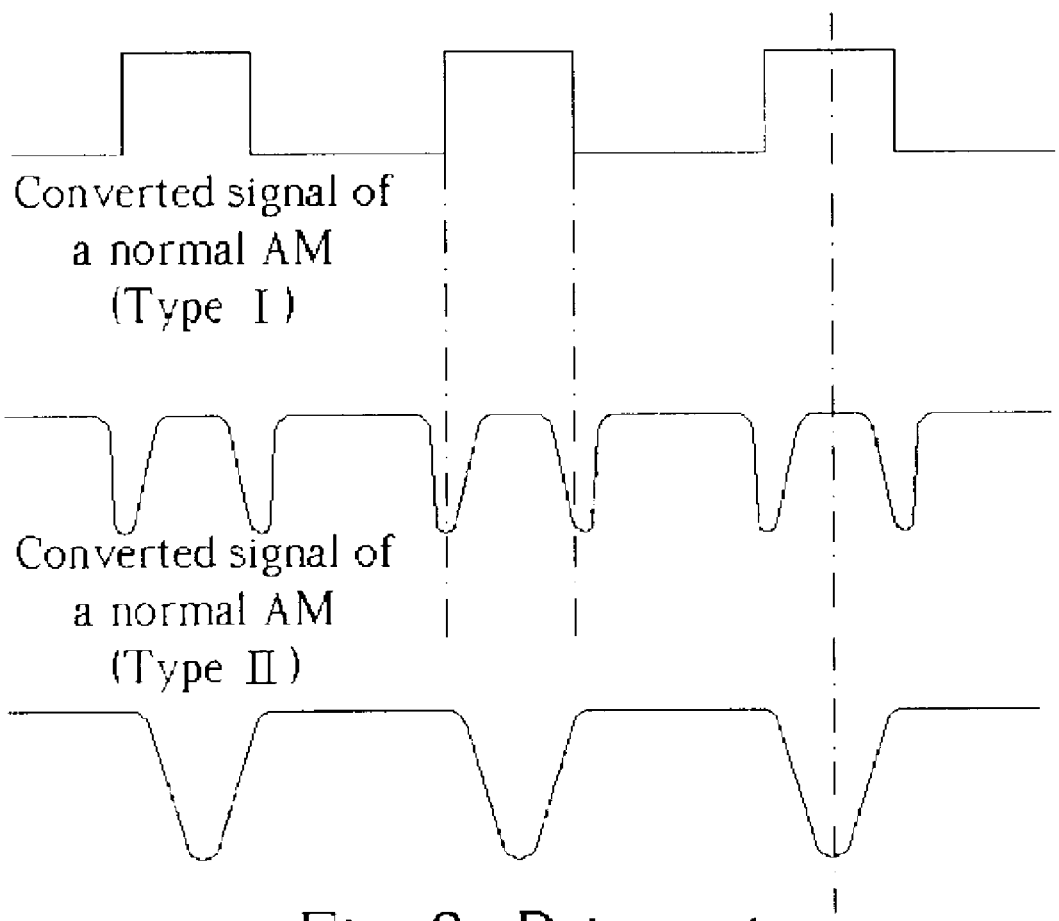
FIG. 3(a) is a schematic diagram of normal AM signals captured and transferred by the FIA, LSA, and LIA sensors.
Figure 3B:
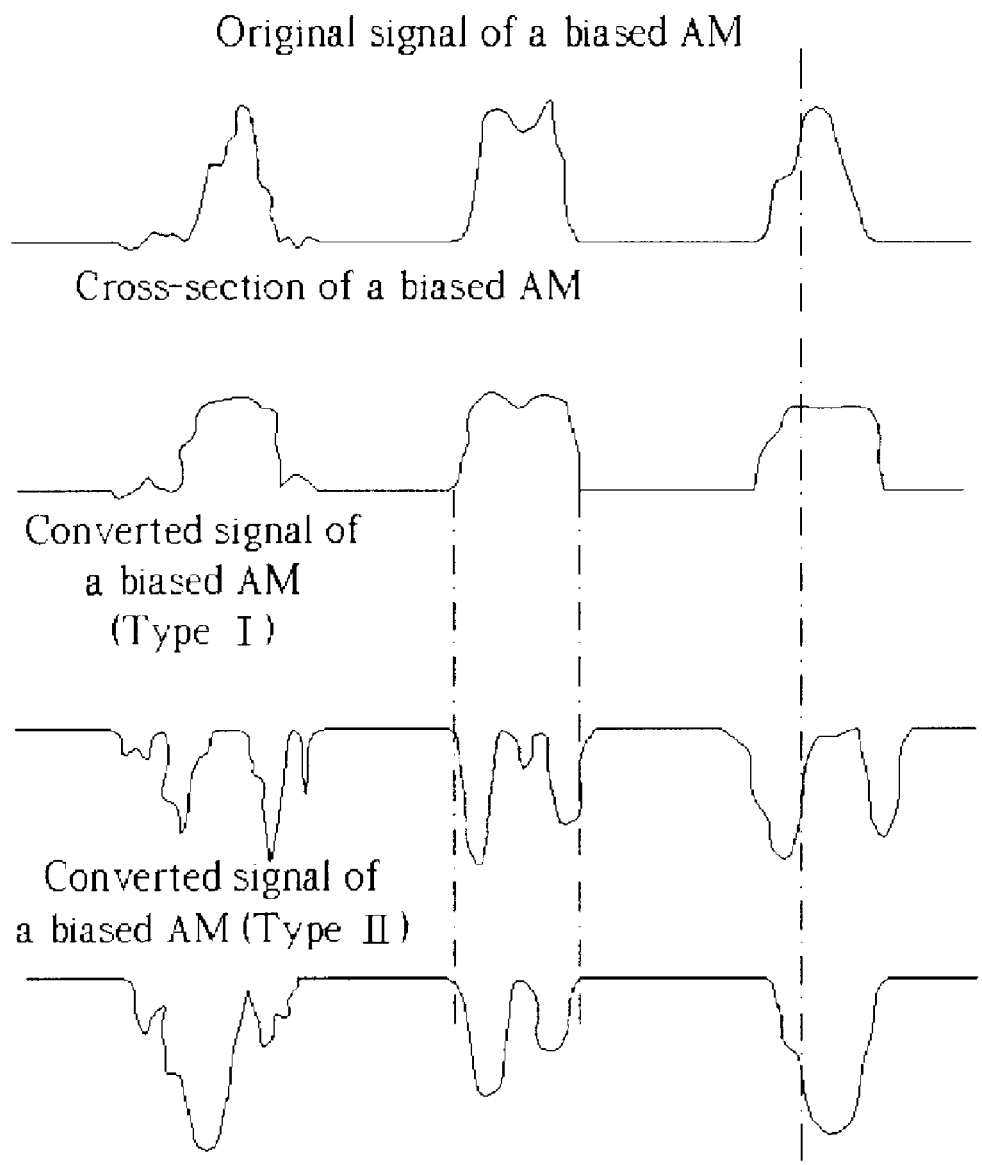
FIG. 3(b) is a schematic diagram of biased AM signals captured and transferred by the FIA, LSA, and LIA sensors.
Figure 4:
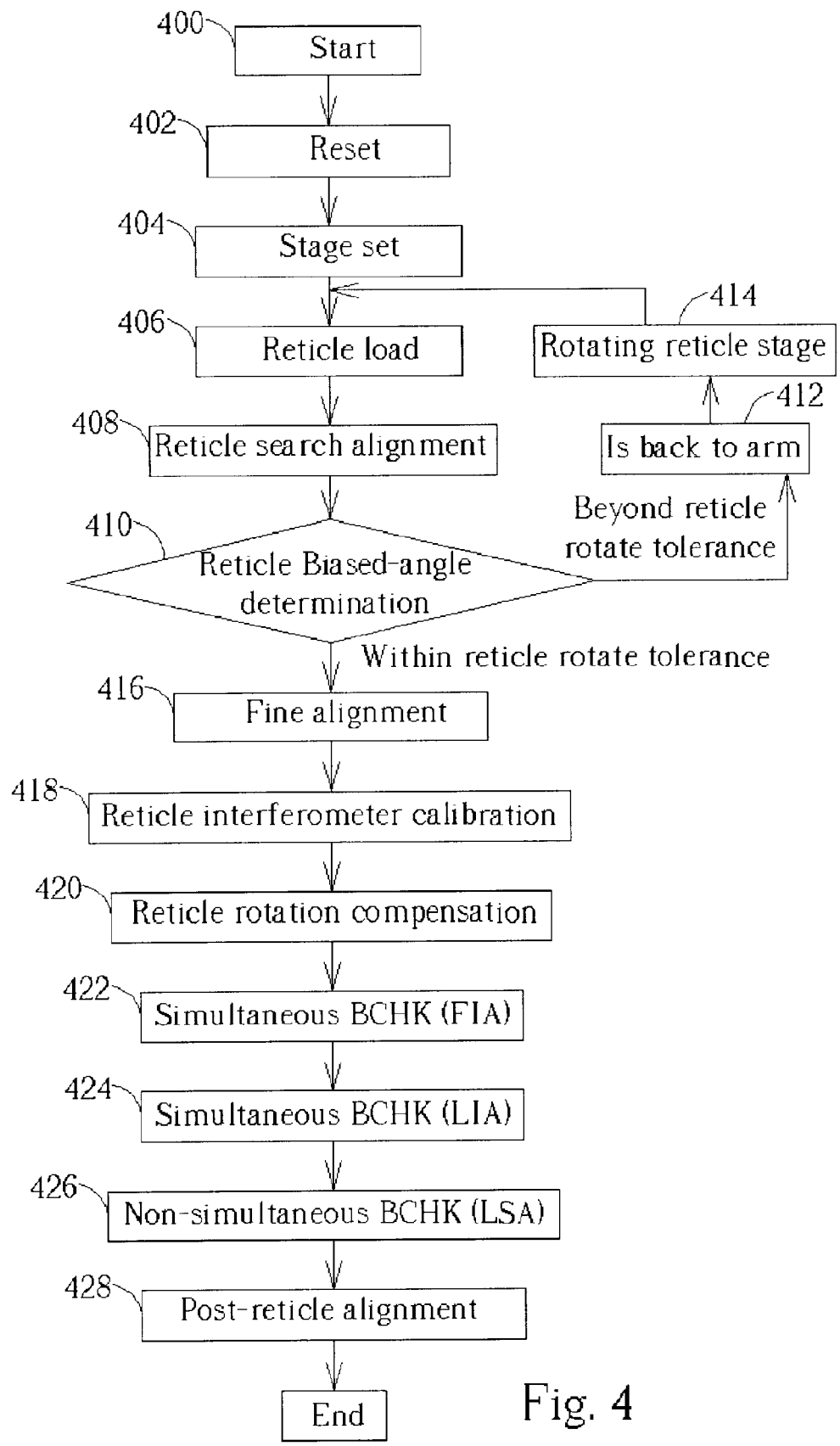
FIG. 4 is an operation flow chart of a reticle alignment procedure of the present invention.

Please refer to FIG. 4. FIG. 4 is a flow chart of a reticle alignment procedure of the present invention. As shown in FIG. 4, the reticle alignment procedure of the present invention starts with a start step 400; a reticle having a current layer to be exposed is installed into an RAM. Then an interferometer reset step 402 is performed to reset an interferometer of the RAS, and a reticle stage set step 404 is performed with a field image alignment sensor (FIA sensor).

A reticle load step 406 is performed to load the reticle, and a reticle search alignment step 408 is performed with a video reticle alignment sensor (VRA sensor) to adjust the coordinates of the reticle by rotating the reticle. Then a reticle biased-angle determination step 410 is performed; if the reticle biased-angle is too large, the reticle is removed by a robot arm and rotated to reload, as step 412 and 414 show in FIG. 4. Afterward, a fine alignment step 416 is performed by utilizing a set of alignment marks (AM) of the reticle, and a reticle interferometer calibration step 418 is performed with the VRA sensor.

A reticle rotation compensation step 420 is performed by rotating the reticle. After that, two simultaneous baseline check (simultaneous BCHK) steps 422 and 424 are performed respectively with the FIA sensor and a laser interferometric alignment sensor (LIA sensor) by employing 6 sets of AMs of the reticle to simultaneously fine adjust the corresponding coordinates of reticle to a baseline of the steppers or to the scanners. Finally, a non-simultaneous BCHK step 426 is performed with a laser step alignment sensor (LSA sensor).

As mentioned above, some inevitable process errors could occur, such as the reduction of uniformity caused by changes of temperature, time, and pressure, and over polishing in the chemical mechanical polishing process. Therefore, if process errors occur, signals captured and transferred from the current-layer wafer AM by the FIA, LSA, and LIA sensors will weaken or generate unnecessary bias. This will affect the alignment procedure even after the reticle search alignment step 408, the reticle biased-angle determining step 410, the fine alignment step 416, the reticle rotation compensation step 420, and the baseline check step 422, 424, and 426. When a lithography process is performed in this case, the quality would reduce due to the inaccurate alignment procedure.

Therefore in the preferred embodiment of the present invention, a post-reticle alignment (PRA) step 428 is performed after accomplishing the non-simultaneous BCHK step 426. An aligned and calibrated VRA sensor is applied to detect the current-layer reticle AM to be exposed, and a charge couple device (CCD) camera is used to capture and compare the image signal of the current-layer reticle AM and the corresponding pre-layer wafer AM of the wafer. The surface of the wafer that will be installed into the WAS comprises a cell pattern area generated by a precedent lithography process and a minor pattern area within a scribe line area. The minor pattern area comprises at least a pre-layer wafer AM transferred from a pre-layer reticle AM.

In the current-layer wafer alignment procedure, image signals of the pre-layer wafer AM are captured, and a computer system is used to directly input the coordinates of the current-layer reticle AM. In the post-reticle alignment step 428, a VRA sensor and a high-speed image processor are used to capture image signals of the current-layer AM of the reticle, transfer the image signals to analog signals or digital signals, and transmit the signals to a computer host system connected to an RAS or a WAS of a stepper or a scanner. The computer host system is used to compare and calibrate the signals of the current-layer reticle AM and the signals of the pre-layer wafer AM.

Finally, a lithography process is performed to transfer the circuit pattern and the current-layer reticle AM onto the semiconductor wafer to form a current-layer wafer AM corresponding to the current-layer reticle AM within the minor pattern area.

In another embodiment of the present invention, two continuous lithography processes are performed on a wafer. Identical to the preferred embodiment of the present invention, the wafer surface comprises a cell pattern area generated during the precedent lithography process and a minor pattern area within a scribe line area. The minor pattern area comprises at least a first on-wafer AM and a circuit pattern. The first reticle comprises at least a first reticle AM and a first circuit pattern. The second reticle comprises at least a second reticle AM and a second circuit pattern. Additionally, the reticle AMs and the on-wafer AMs are captured and transferred to analog signals or digital signals by a high-speed image processor.

Following the operation procedure shown in FIG. 4, a start step 400 is performed to install the first reticle into the RAM, an interferometer-reset step 402 is performed to reset the interferometer, a stage set step 404 is performed with the FIA sensor, and a reticle load step 406 is performed to load the first reticle.

A reticle search alignment step 408 is performed by a CCD camera of a VRA sensor to capture images of the first reticle AM, and the coordinates of the first reticle are adjusted by rotating the first reticle. Then a reticle biased-angle determination step 410 is performed; if the biased angle is too large, remove the first reticle with a robot arm and reload, as step 412 and 414 show in FIG. 4. A fine alignment step 416 is performed by utilizing the first reticle AM, and a reticle interferometer calibration step 418 is performed with the VRA sensor.

A reticle rotating compensation step 420 is performed by rotating the first reticle, and two simultaneous BCHK steps 422 and 424 are performed with the FIA and the LIA sensors by utilizing the first reticle AM to fine adjust the corresponding coordinates of the first reticle to a baseline of a stepper or a scanner. Then a non-simultaneous BCHK step 426 is performed with the LSA sensor.

After that, a post-reticle alignment (PRA) step 428 is performed with an aligned and calibrated VRA sensor to detect the first reticle AM of the first reticle to be exposed, and to capture and compare image signals of the first reticle AM and the first on-wafer AM with the charge couple device (CCD) camera.

In the current-layer wafer alignment procedure, image signals of the first on-wafer AM are captured, and a computer system is used to directly input the coordinates of the first reticle AM. In the post-reticle alignment step 428, a VRA sensor and a high-speed image processor are used to capture image signals of the first AM of the first reticle, transfer the image signals to analog signals or digital signals, and transmit the signals to a computer host system connected to an RAS or a WAS of a stepper or a scanner. The computer host system is used to compare and calibrate the signals of the first reticle AM and the signals of the on-wafer AM.

After that, a lithography process is performed to transfer the first circuit pattern of the first reticle and the first reticle AM onto the semiconductor wafer to form a second on-wafer AM overlaid by the first on-wafer AM and the first reticle AM within the minor pattern area.

Repeating the operation procedure shown in FIG. 4 first, the start step is performed to install the second reticle into the RAS. Then an interferometric reset step 402, a stage set step 404, a reticle load step 406, a reticle search alignment step 408, a biased-angle determination step 410, a fine alignment step 416, a reticle interferometer calibration step 418, a reticle rotation compensation step 420, and baseline check step 422, 424, and 426 are performed in order as described above.

After that, a post-reticle alignment (PRA) step 428 is performed to detect the second reticle AM of the second reticle to be exposed with an aligned and calibrated VRA sensor, and to capture and compare image signals of the second on-wafer AM with a charge couple device (CCD) camera.

In the current-layer wafer alignment procedure, image signals of the second on-wafer AM is captured, and a computer system is used to directly input the coordinates of the second reticle AM of the second reticle. In the post-reticle alignment step 428, a VRA sensor and a high-speed image processor are used to capture image signals of the second reticle AM of the second reticle, transfer the image signals to analog signals or digital signals, and transmit the signals to a computer host system connected to an RAS or a WAS of a stepper or a scanner. The computer host system is used to compare and calibrate the signals of the second reticle AM and the signal of the second on-wafer AM.

Finally, a second lithography process is performed to transfer the second circuit pattern of the second reticle and the second reticle AM onto the semiconductor wafer to form a third on-wafer overlaid by the second on-wafer AM and the second reticle AM within the minor pattern area.

In contrast to the prior art, a post-reticle alignment step 428 is performed after finishing the reticle alignment procedure of the prior art. An aligned and calibrated VRA sensor is applied to detect the current-layer reticle AM to be exposed, and a charge couple device (CCD) camera is used to capture and compare image signals of the current-layer reticle AM and the corresponding pre-layer wafer AM on the wafer. In the present invention the current-layer reticle AM and the pre-layer wafer AM can be calibrated by a computer host system connected to a reticle alignment system (RAS) and a wafer alignment system (WAS) of a stepper or a scanner. Therefore, when signals are captured and transferred from the pre-layer wafer AM with a field image alignment sensor (FIA sensor), a laser interferometric alignment sensor (LIA sensor), and a laser step alignment sensor (LSA sensor), the bias resulting from precedent process errors can be removed. The current-layer reticle and the pre-layer wafer AM are aligned more precisely so that the accuracy of reticle pattern transferring is ensured.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A reticle alignment procedure employed on a semiconductor wafer, a surface of the semiconductor wafer comprising a cell pattern area and a minor pattern area, the minor pattern area comprising at least one pre-layer wafer alignment mark (pre-layer wafer AM) transferred onto the semiconductor wafer from a pre-layer reticle alignment mark (pre-layer reticle AM) on a pre-layer reticle, the reticle alignment procedure comprising:

providing a current-layer reticle, the current-layer reticle comprising at least one current-layer reticle alignment mark (current-layer reticle AM) and a circuit pattern;

performing a baseline check (BCHK) to align the current-layer reticle AM with the pre-layer wafer AM;

capturing and comparing image signals of the current-layer reticle AM and the pre-layer wafer AM to calibrate a corresponding coordinate of the current-layer reticle to the semiconductor wafer; and performing a lithography process to simultaneously transfer layouts of the circuit pattern and the current-layer reticle AM onto the semiconductor wafer to form a current-layer wafer alignment mark (current-layer wafer AM) within the minor pattern area of the semiconductor wafer corresponding to the current-layer reticle alignment mark.

2. The reticle alignment procedure of claim 1 wherein the minor pattern area is within a scribe line area.

3. The reticle alignment procedure of claim 1 wherein images of the alignment marks are produced by utilizing a video reticle sensor (VRA sensor) of a reticle alignment machine.

4. The reticle alignment procedure of claim 1 wherein a high-speed image processor is employed to capture, transfer, and store images of the alignment marks.

5. The reticle alignment procedure of claim 3 wherein the VRA sensor utilizes a charge couple device camera (CCD camera) to capture images of the alignment marks.

6. A method of utilizing a reticle alignment machine to calibrate a corresponding coordinate of a reticle to a semiconductor wafer during a plurality of lithography processes, the plurality of lithography processes comprising at least a first lithography process and a second lithography process performed by utilizing a first reticle and a second reticle, respectively, a surface of the semiconductor wafer comprising a cell pattern area and a minor pattern area, the minor pattern area comprising at least a first on-wafer alignment mark (first on-wafer AM), the first reticle comprising at least a first reticle alignment mark and a first circuit pattern, the second reticle comprising at least a second reticle alignment mark and a second circuit pattern, the method comprising:

provinding the first reticle;

performing a baseline check to align the first reticle alignment mark on the first reticle with the first on-wafer alignment mark;

capturing and comparing image signals of the first reticle AM and the first on-wafer AM to calibrate a corresponding coordinate of the first reticle to the semiconductor wafer;

performing the first lithography process to simultaneously transfer layouts of the first circuit pattern and the first reticle alignment mark onto the semiconductor wafer to form a second on-wafer alignment mark (second on-wafer AM) within the minor pattern area of the semiconductor wafer, the second on-wafer alignment mark being a combination of the first on-wafer alignment mark and the first reticle alignment mark; providing the second reticle;

performing a baseline check to align the second reticle alignment mark on the second reticle with the second on-wafer alignment mark;

capturing and comparing image signals of the second reticle AM and the second on-wafer AM to calibrate a corresponding coordinate of the second reticle to the semiconductor wafer; and performing a second lithography process to simultaneously transfer layouts of the second circuit pattern and the second reticle alignment mark onto the semiconductor wafer to form a third on-wafer alignment mark (third on-wafer AM) within the minor pattern area of the semiconductor wafer, the third on-wafer alignment mark being a combination of the second on-wafer alignment mark and the second reticle alignment mark.

7. The method of claim 6 wherein the minor pattern area is within a scribe line area.

8. The method of claim 6 wherein a high-speed image processor is employed to capture, transfer, and store images of the alignment marks.

9. The method of claim 6 wherein the reticle alignment machine comprises a VRA sensor for producing images of the alignment marks.

10. The method of claim 9 wherein the VRA sensor utilizes a CCD camera to capture images of the alignment marks.

* * * * *